United States Patent [19]
Dunsmore

[11] Patent Number: 5,103,195
[45] Date of Patent: Apr. 7, 1992

[54] HYBRID GAAS MMIC FET-PIN DIODE SWITCH

[75] Inventor: Joel P. Dunsmore, Sebastopol, Calif.

[73] Assignee: Hewlett-Packard Company, Palo Alto, Calif.

[21] Appl. No.: 420,973

[22] Filed: Oct. 13, 1989

[51] Int. Cl.⁵ .............................................. H01P 1/15
[52] U.S. Cl. ................................... 333/103; 333/104; 333/262; 307/571; 307/241
[58] Field of Search .............. 333/101, 103, 104, 262; 307/239, 241-243, 248, 571

[56] References Cited

U.S. PATENT DOCUMENTS 4,556,808 12/1985 Coats ................................... 333/262
4,897,563 1/1990 Bahl ................................ 333/101 X
4,929,855 5/1990 Ezzeddine ........................... 307/571

FOREIGN PATENT DOCUMENTS 52101 3/1985 Japan .................................. 333/105

Primary Examiner—Eugene R. LaRoche
Assistant Examiner—Benny Lee
Attorney, Agent, or Firm—William C. Milks, III

[57] ABSTRACT

A hybrid transfer switch comprises at least a pair of GaAs MMIC FET SPDT switches coupled together by a transmission line. PIN diodes are coupled to the transmission line and to DC bias circuitry. The hybrid switch performance closely approximates that of a mechanical-/electromechanical transfer switch while providing improved repeatability.

27 Claims, 14 Drawing Sheets

HYBRID GAAS MMIC FET-PIN DIODE SWITCH

FIELD OF THE INVENTION

This invention relates generally to electronic switches. More particularly, this invention relates to a hybrid GaAs MMIC FET-PIN diode transfer switch having high "off" state isolation, low "on" state insertion loss and broad bandwidth.

BACKGROUND OF THE INVENTION

Transfer switches are well known in the art and are commonly employed in connection with electronic test equipment, such as network analyzers, to route a signal from one path to another, e.g., from a straight through condition to a path which passes through a device under test ("the test path"). The signals that are switched are typically in the RF and microwave range, so special consideration must be given to design of these switches. Generally, the switches must exhibit low insertion loss when on, high isolation when off, good impedance match, and high stability and repeatability (including insertion loss and isolation stability and repeatability), all over a broad bandwidth and over temperature changes. It is desirable that the frequency range over which the switch exhibits these characteristics extends, at the low end, as close to DC as possible, and well into the microwave band at the high end.

Mechanical and electromechanical transfer switches have been widely used in the prior art. The model HP 8761 A/B and HP 33311 B/C coaxial switches are exemplary. Also exemplary are electromechanical transfer switches employed in the model HP 85046 A/B, HP 85047A, and HP 8753 test sets. All of the aforementioned equipment is manufactured by Hewlett-Packard Company, Palo Alto, Calif. (hereinafter "HP").

Mechanical and electromechanical transfer switches exhibit many of the aforementioned characteristics, but are subject to wear and failure and hence are not suitable for use in continuous switching applications. They are also bulky and expensive. Additionally, mechanical and electromechanical transfer switches do not provide repeatable return loss as the switch is cycled—a return loss stability of about 0.005, or minus 46 dB, is common. The switching speed of mechanical and electromechanical transfer switches is also limited.

Solid state transfer switches are also known in the art. Generally, known solid state transfer switches fall into two categories: PIN diode switches; and, GaAs MMIC (gallium arsenide monolithic microwave integrated circuit) FET switches. Both overcome the aforementioned failings of mechanical/electromechanical transfer switches, but they suffer from other shortcomings. One example of a PIN diode switch is the model HP 333016C manufactured by HP. Examples of a GaAs MMIC FET switch are the models SW-200 and SW-210 manufactured by Adams Russell Electronics Co., Inc., of Burlington, Mass.

PIN diode switches are satisfactory for high frequency (e.g., microwave) applications, but they exhibit poor isolation below frequencies of about 45 MHz. Reverse biased series PIN diodes can be used to achieve greater isolation at low frequencies, but this results in another problem: the series diodes must be strongly forward biased in the switch's "on" state, resulting in increased insertion loss and insertion loss drift caused by heating effects. Moreover, series PIN diodes can cause distortion at low frequencies due to self bias in the diodes from RF energy. Additionally, PIN diode switches require large drive currents to achieve the needed isolation. Bias circuits for supplying such large drive currents are difficult to manufacture. Still further, PIN diode switches exhibit poor impedance matching in their "off", or isolation, state because they are effectively shunts in this state. Although matching resistors can improve the match, they result in greater insertion loss.

GaAs MMIC FET switches, on the other hand, typically exhibit very good isolation at low frequencies, but poor isolation at high frequencies. They therefore complement the performance of PIN diode switches. Nonetheless, known GaAs MMIC FET switches do not provide the same isolation as mechanical transfer switches, which can be greater than 100 dB to 6 GHz. This is because, although GaAs MMIC FET switches generally have a series-shunt configuration, and use one or more GaAs chips, the series impedance of the shunt devices (FET's) is too high to obtain the required isolation. Also, a large number of GaAs chips is needed to obtain the required isolation, and the insertion loss increases as the number of chips increases. Furthermore, the low frequency power handling capabilities of GaAs MMIC FET switches is limited by the RF self bias of the GaAs FET's on the chips. Finally, known GaAs MMIC FET switches are unacceptably mismatched in both the "on" and "off" states.

It is therefore desirable to provide a high speed, solid state transfer switch that: exhibits high "off" state isolation and low "on" state insertion loss; is well matched to the systems with which it is used; and, exhibits stability and repeatability, including insertion loss and isolation stability and repeatability, all across a wide bandwidth that extends from substantially DC to well into the microwave range, and also over temperature changes. It is also desirable that the switch be compact, reliable and inexpensive. Preferably, such a switch would exhibit pin for pin compatibility with a mechanical switch, such as the model HP 33311 B/C, which it is intended to replace. The present invention achieves these goals.

SUMMARY OF THE INVENTION

An electronic switch according to one embodiment of the present invention comprises: (a) at least first and second electronic switches each having at least two RF ports, one defining an input port, the other defining an output port; (b) a first transmission line having a characteristic impedance and electrical length $l_1$ cascaded with the output port of the first switch; (c) a second transmission line having a characteristic impedance and electrical length $l_2$ cascaded with the input port of the second switch; and, (d) at least one shunt PIN diode connected to with the first and second transmission lines, and coupled to bias circuitry. The characteristic impedance and electrical lengths $l_1$, $l_2$ of the first and second transmission lines are selected to provide input and output impedances within a predefined range of impedances.

In a most preferred embodiment of the invention, there is a common port and two switched ports, and the electronic switch comprises first, second and third GaAs MMIC FET switches. Two PIN diodes, defining a first pair of PIN diodes, are connected in parallel with each other, and the anodes of the first pair of PIN diodes are connected to a first switched port of the first GaAs MMIC FET switch. Two additional PIN diodes, defining a second pair of PIN diodes, are connected in parallel with each other, and the anodes of the second pair of PIN diodes are connected to a second switched port of the first GaAs MMIC FET switch. A first switched port of the second GaAs MMIC FET switch is connected to the anodes of the first pair of PIN diodes. A second switched port of the second GaAs MMIC FET switch is grounded through a first resistive load. The anodes of the second pair of PIN diodes are connected to a first switched port of the third GaAs MMIC FET switch. A second switched port of the third GaAs MMIC FET switch is grounded through a second resistive load. Bias circuitry provides a level of DC biasing to the PIN diodes and GaAs MMIC FET switches.

In the most preferred embodiment of the present invention, the switches are GaAs MMIC FET SPDT switches. Also in the most preferred embodiment, the PIN diode is biased with a $V_d$ matching circuit described more fully below. The most preferred embodiment is pin for pin compatible with the HP 33311 B/C mechanical switch.

BRIEF DESCRIPTION OF THE DRAWINGS

FIG. 4, comprising

DETAILED DESCRIPTION OF THE INVENTION

Figure 1:
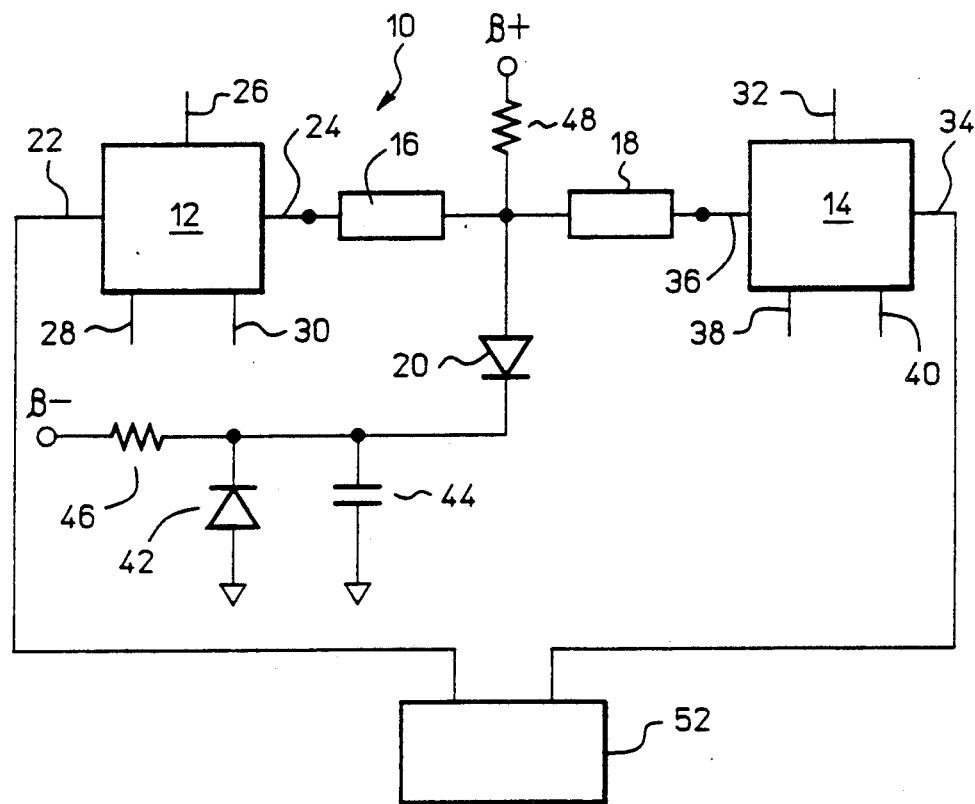
FIG. 1 is a schematic diagram of a two-stage hybrid GaAs MMIC FET-PIN diode transfer switch illustrating the principles of the present invention.

Referring now to the drawings wherein like numerals represent like elements, there is shown in FIG. 1 a schematic diagram of a hybrid two-stage GaAs MMIC FET-PIN diode switch 10 illustrating the principles of the present invention. The exemplary switch 10 is shown and described herein for switching signals through or around a device under test 52, i.e., for switching the device 52 in and out of a circuit, but it will be appreciated that the switch 10, as well as all embodiments of the invention described herein, may be employed for routing signals from one path to another. The exemplary switch 10 comprises two GaAs MMIC single-pole-double-throw (SPDT) FET switches 12, 14 cascaded with two transmission lines 16, 18. The anode of a shunt PIN diode 20 is connected to the junction of the first and second transmission lines 16, 18, as shown. The transmission lines 16, 18 can alternately be a single line tapped in approximately the center, such that it is center tapped by the anode of PIN diode 20.

The two switches 12, 14 preferably each comprise three RF ports. An example of such a switch is the model SW-200 described above. Referring to switch 12, the "RF$_{com}$", or "common", port is labeled 26 (labeled 32 for switch 14) and the two switched RF ports, RF$_1$ and RF$_2$, are labeled 22 and 24, respectively (labeled 36, 34, respectively, for switch 14). Switch 12 is controlled by applying appropriate control signals to control terminals A and B (labeled 28, 30, respectively). Similarly switch 14 is controlled by applying appropriate control signals to control terminals A and B (labelled 38, 40, respectively).

Figure 6A:
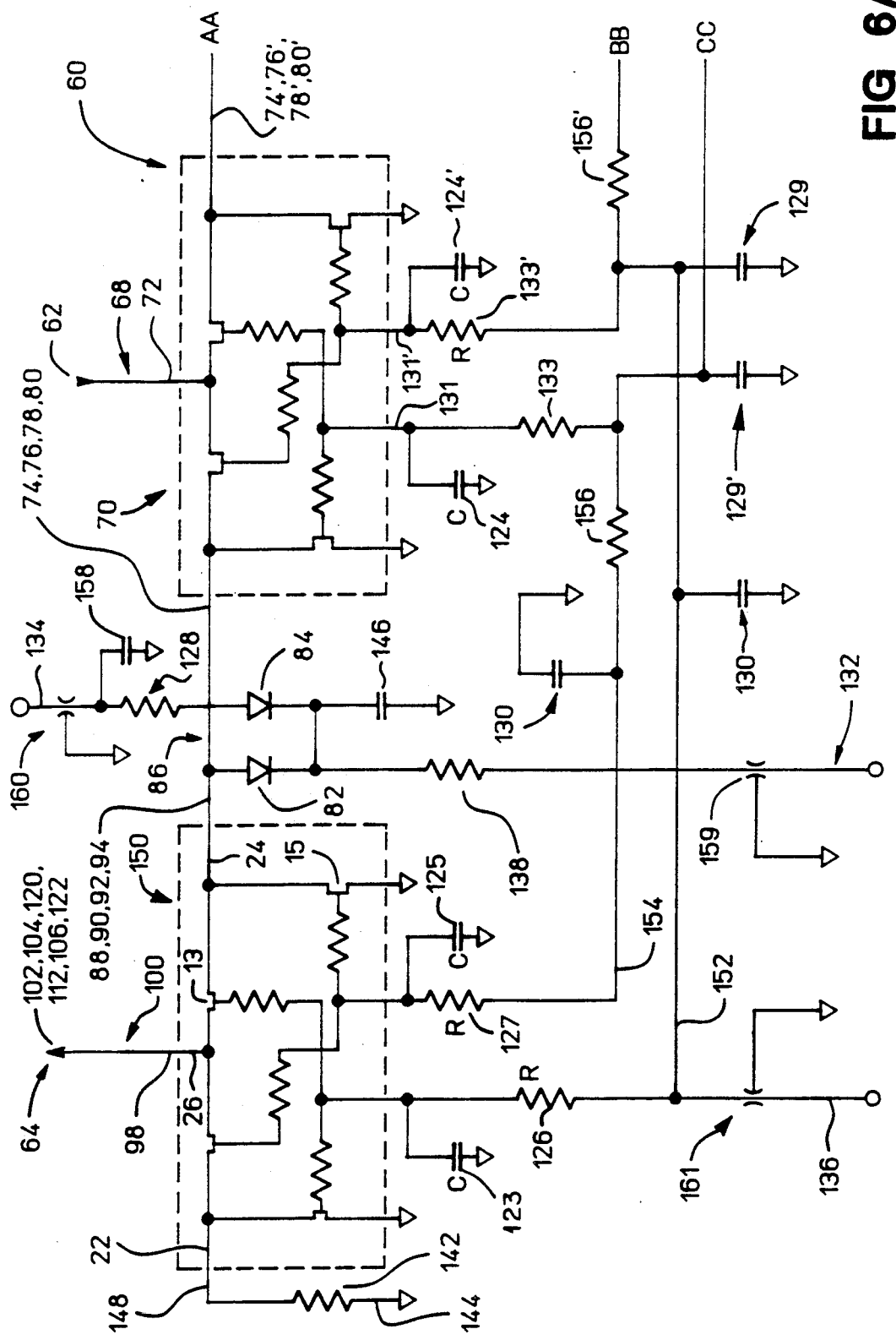
FIGS. 6A and 6B are a schematic diagram of the switch of FIG. 4.
Figure 6B:
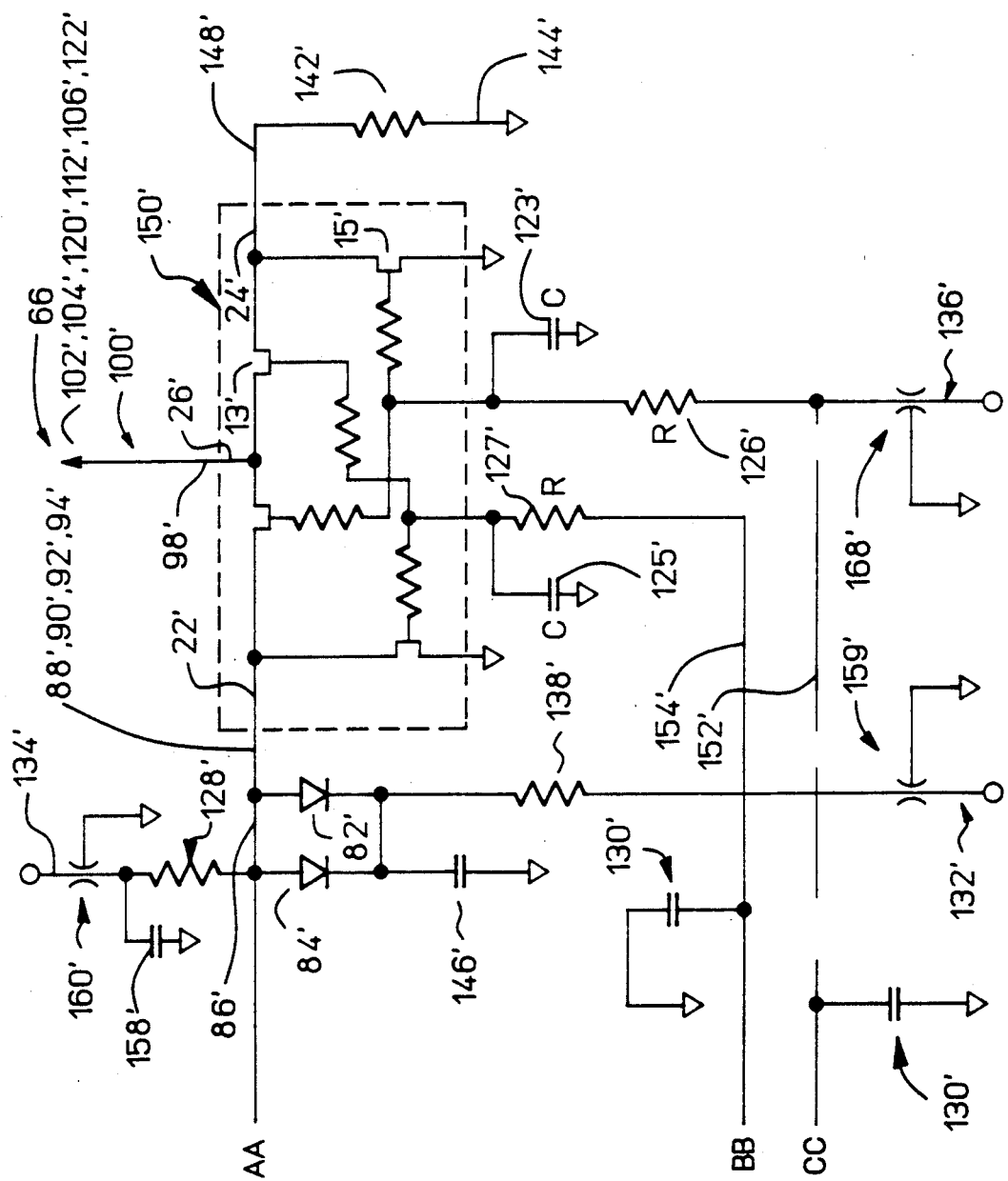

The GaAs MMIC FET switch comprises a series-shunt FET configuration, as shown in blocks 150 and 150' of FIGS. 6A and 6B respectively. In the isolation (high loss) state, the series FET 13 is open, providing low frequency isolation. The shunt FET 15 provides a high frequency shunt. The quarter-wavelength transmission line 16 (FIG. 1) connected to the PIN diode 20 (diodes 82, 82' of FIGS. 6A and 6B) appears as a high impedance at high frequencies. The diode 20 is forward biased to a low impedance.

In the low loss state, forward bias of the FET 13 gate-to-source junction causes gate current to flow. The voltage on resistor 48 (FIG. 1) (resistors 128, 128' in FIGS. 6A and 6B) is chosen to both reverse bias the PIN diode 20, and to maintain zero volts DC on the drain line 26, thus drawing the same current that flows into the series FET 13 gate. This prevents the gate-to-source voltage $V_{gs}$ from reaching pinch off in the series FET's, even with large RF signals present.

As shown in FIG. 1, resistors 46, 48, PIN diode 42, and capacitor 44 constitute DC bias circuitry for biasing PIN diode 20. As shown, resistor 48 is coupled to a source of DC voltage, B+, and to the anode of PIN diode 20. The cathode of PIN diode 20 is coupled to a parallel combination of capacitor 44 and matched PIN diode 42, as shown. Note that the cathodes of the two PIN diodes 20, 42 are coupled together. One side of the parallel combination of diode 42 and capacitor 44 is coupled to a source of DC voltage, B−, and the other side is coupled to ground. The operation of the exemplary switch 10 and bias circuitry 42, 44, 46, 48 is described below.

When the switches 12, 14 are set to their "off" state at the A and B terminals 28, 38 and 30, 40, respectively, a signal applied at port 26 of switch 12 will be directed to port 24, through transmission lines 16 and 18, into switch 14 at port 36, and out of switch 14 at port 32. Thus, the device 52 is out of the circuit when the switches 12, 14 are in this state. PIN diode 20 is reverse biased and does not add substantially to the insertion loss through the switch.

When switches 12, 14 are set to their "on" state, a signal applied at port 26 will be directed to port 22, through the device 52, then into switch 14 at port 34, and out of switch 14 at port 32. PIN diode 20 is forward biased by the DC bias circuitry so that a low impedance path to ground is provided for RF signals, i.e., through PIN diode 20 and capacitor 44. These signals are then partially reflected back to transmission lines 16, 18. The addition of the shunt PIN diode 20 greatly increases the isolation of the signal from port 26 to port 32, the only signal path being through device 52. Thus, the device 52 is in the circuit when the switches 12, 14 are in this state.

The electrical length of the transmission lines 16, 18 can be about one quarter of a wavelength at 6.0 GHz, 6.0 GHz being the highest frequency in the desired operating frequency range. These lengths can be adjusted, however, when tuning the circuit to achieve a better-matched circuit in accordance with well known principles. The impedance of the transmission lines 16, 18 is preferably about 55 ohms. This can also be adjusted for improved match to 50 ohms.

Many GaAs MMIC FET switches, including the aforementioned SW-200, require that the voltage on the transmission lines 16, 18 be less than approximately 0.4 volts. The PIN diode 20, when forward biased, however, has a voltage drop of approximately 0.7 volts. Use of a $V_d$ matching technique to provide DC bias avoids any need for DC blocking capacitors in the transmission lines, while maintaining the bias voltage thereon at the required level. Thus, a preferred DC biasing circuit employs such a technique. Accordingly, the $V_d$ matching technique is incorporated by providing that the PIN diodes 20 and 42 are matched so that diode 42 conducts the same amount of current as the PIN diode 20 and pulls the voltage at the cathode of the PIN diode 20 below ground level. This holds the voltage on the transmission lines 16, 18 to within a few tenths of a volt of ground. The capacitor 44 provides a low impedance path to ground for RF signals. However, it will be apparent to those skilled in the art that other biasing circuitry can be employed.

Figure 2:
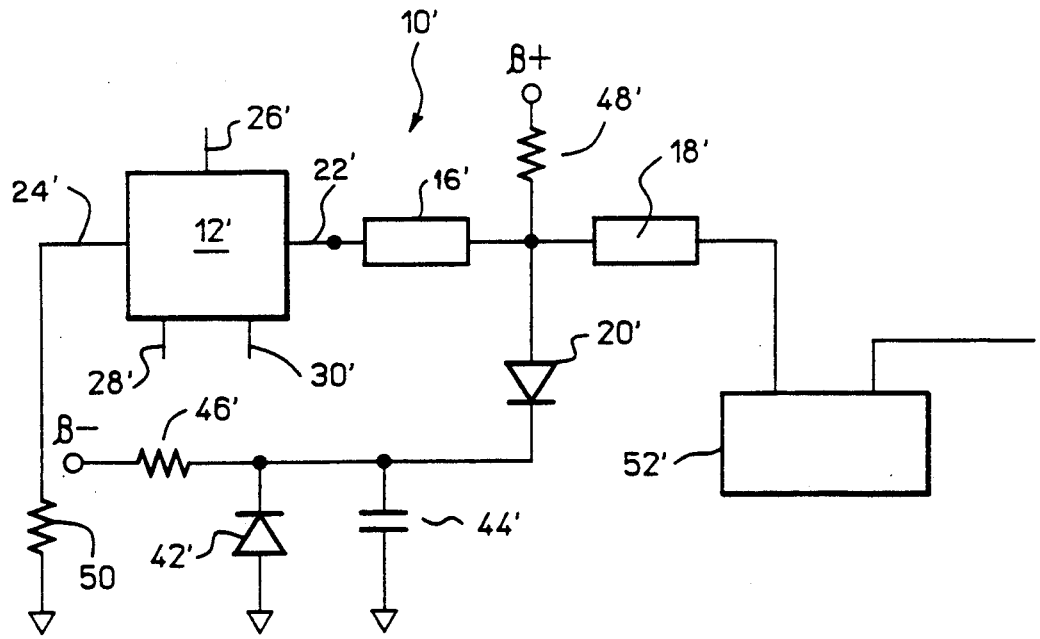
FIG. 2 is a schematic diagram of a single-stage hybrid GaAs MMIC FET-PIN diode transfer switch illustrating the principles of the present invention.

Referring now to FIG. 2, there is illustrated a single stage hybrid GaAs MMIC FET-PIN diode switch 10' illustrating the principles of the present invention and in which elements labeled with primed numerals are identical to the elements in FIG. 1 identified with unprimed numerals. The switch 10' of FIG. 2 employs a single GaAs MMIC FET switch 12' cascaded with transmission line 16'. The anode of shunt PIN diode 20' is connected to transmission lines 16' and 18'. The unused port 24' of the switch 12' is preferably terminated with a 50 ohm resistive load 50. The principles of the circuit of FIG. 1 are otherwise applicable to the circuit of FIG. 2.

Figure 3A:
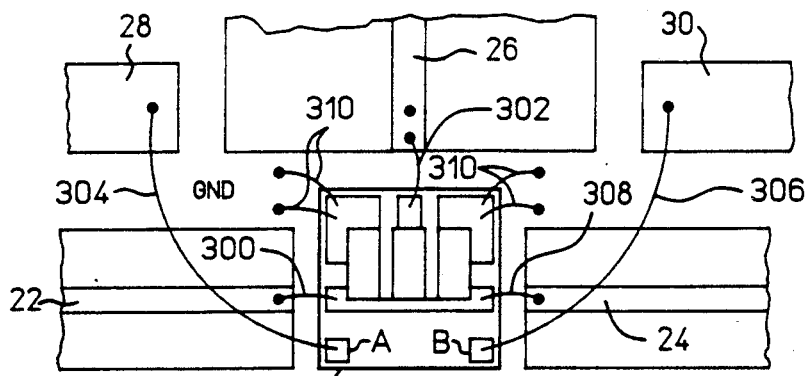
FIGS. 3A, 3B and 3C illustrate an exemplary topology of the two-stage hybrid GaAs MMIC FET-PIN diode transfer switch of FIG. 1.
Figure 3B:
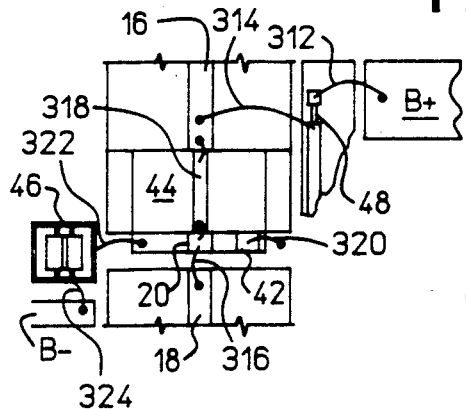
Figure 3C:
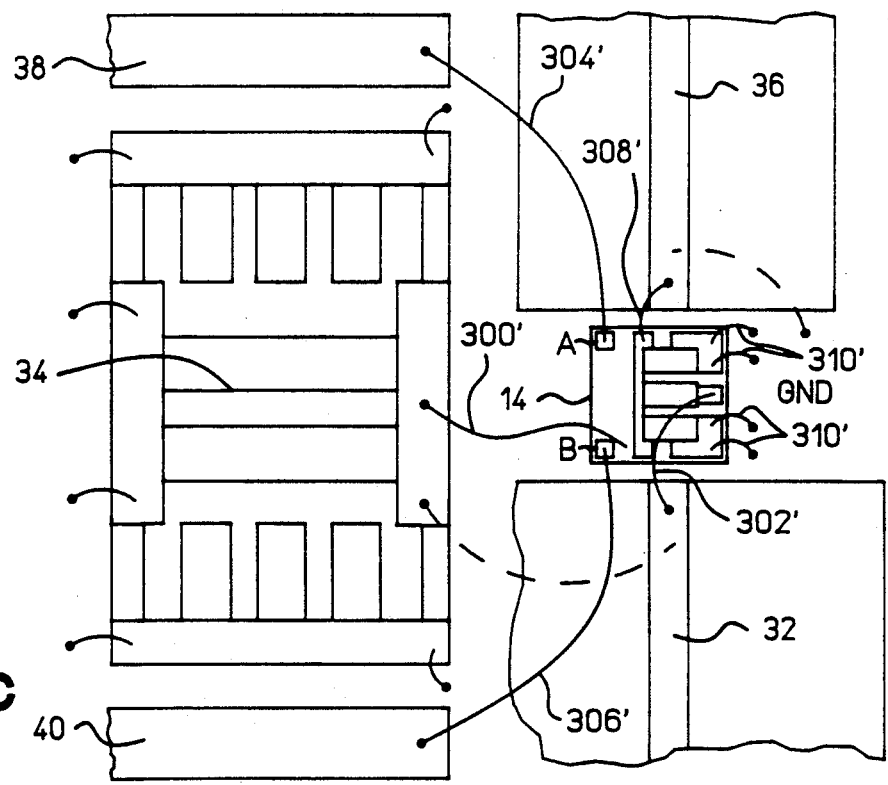

FIGS. 3A, 3B and 3C illustrate an exemplary topology for a switch of the type of FIG. 1. FIG. 3A illustrates physical connections to switch 12, FIG. 3B illustrates connections to the PIN diode 20 and DC biasing circuitry, and FIG. 3C illustrates connections to switch 14. Like reference numerals designate like components in FIGS. 1, 3A, 3B and 3C, so the circuit layout is readily apparent. The switches 12, 14 may be bonded to a substrate by conductive epoxy or other well known means, and wire bonding may be employed to make the connections shown. As shown in FIG. 3A, the GaAs MMIC FET switch 12 is connected to the switched RF port 22 by a bond wire 300. The switch 12 is connected to the common port 26 by a bond wire 302. Control terminal A of the switch 12 is connected to the control terminal 28 by a bond wire 304. Control terminal B of the switch 12 is connected to the control terminal 30 by a bond wire 306. A bond wire 308 connects the switch 12 to the switched RF port 24. Finally, bond wires 310 effect needed connections between the switch 12 and ground.

Similarly, as shown in FIG. 3C, the GaAs MMIC FET switch 14 is connected to the switched RF port 34 by a bond wire 300'. The switch 14 is connected to the common port 32 by a bond wire 302'. Control terminal A of the switch 14 is connected to the control terminal 38 by a bond wire 304'. Control terminal B of the switch 14 is connected to the control terminal 40 by a bond wire 306'. A bond wire 308' connects the switch 14 to the switched RF port 36. Finally, bond wires 310' effect needed connections between the switch 14 and ground.

Also, as shown in FIG. 3B, a bond wire 312 connects the B+ voltage supply to the resistor 48. The resistor 48 is in turn connected to the first and second transmission lines 16 and 18 by bond wires 314 and 316, respectively, which are connected to respective ends of ribbon 318. The ribbon 318 also connects the PIN diode 20 to the first and second transmission lines 16 and 18. The PIN diode 42 is connected to ground by a bond wire 320. A bond wire 322 connects the PIN diode 42 and the capacitor 44 to the resistor 46. Finally, the resistor 46 is connected to the B− voltage supply by a bond wire 324. It has been discovered that a top cover (not shown) over the circuit improves its performance.

Figure 4A:
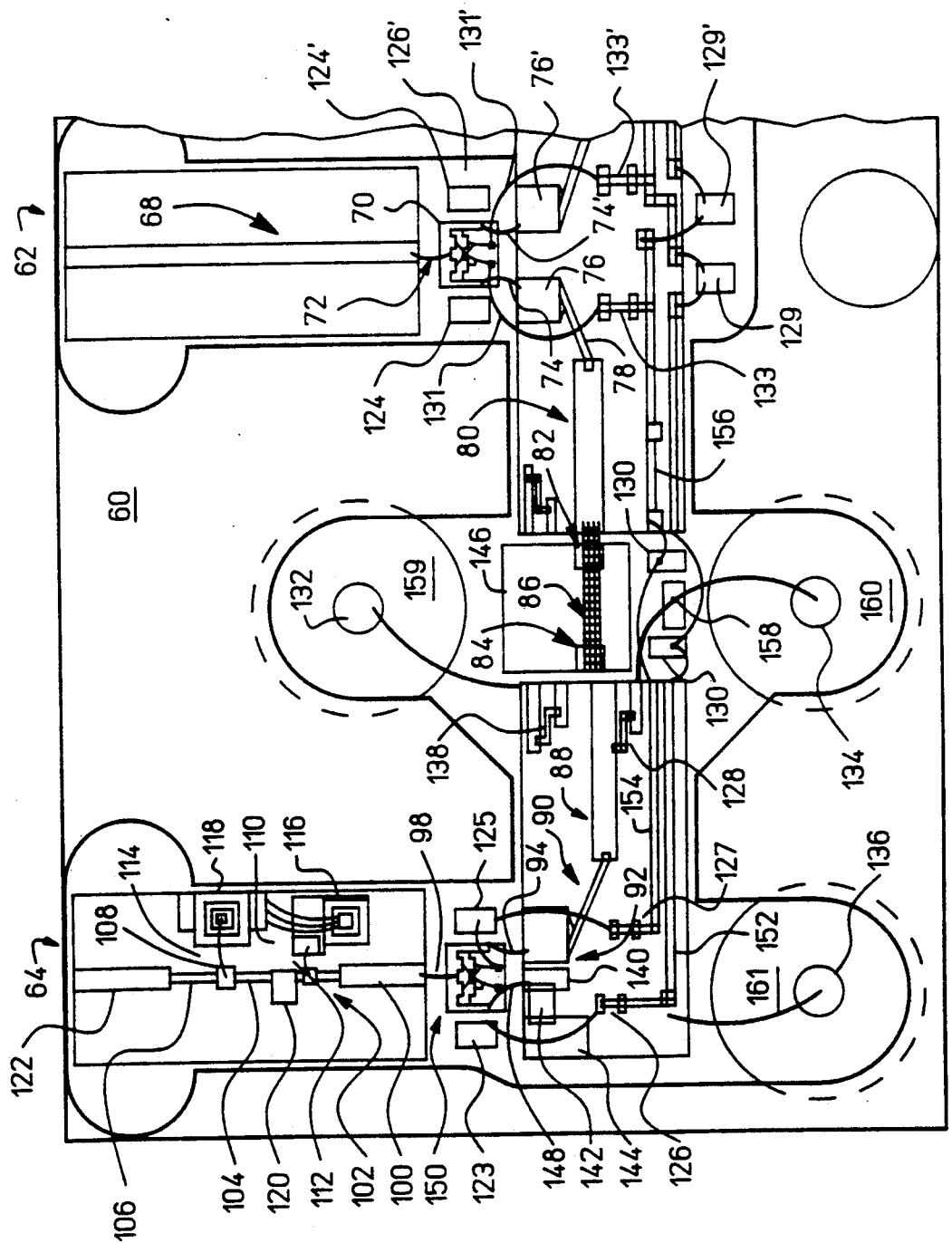
FIGS. 4A and 4B, illustrates the topology of the most preferred embodiment of a hybrid, multiple port GaAs MMIC FET-PIN diode switch according to the invention.
Figure 4B:
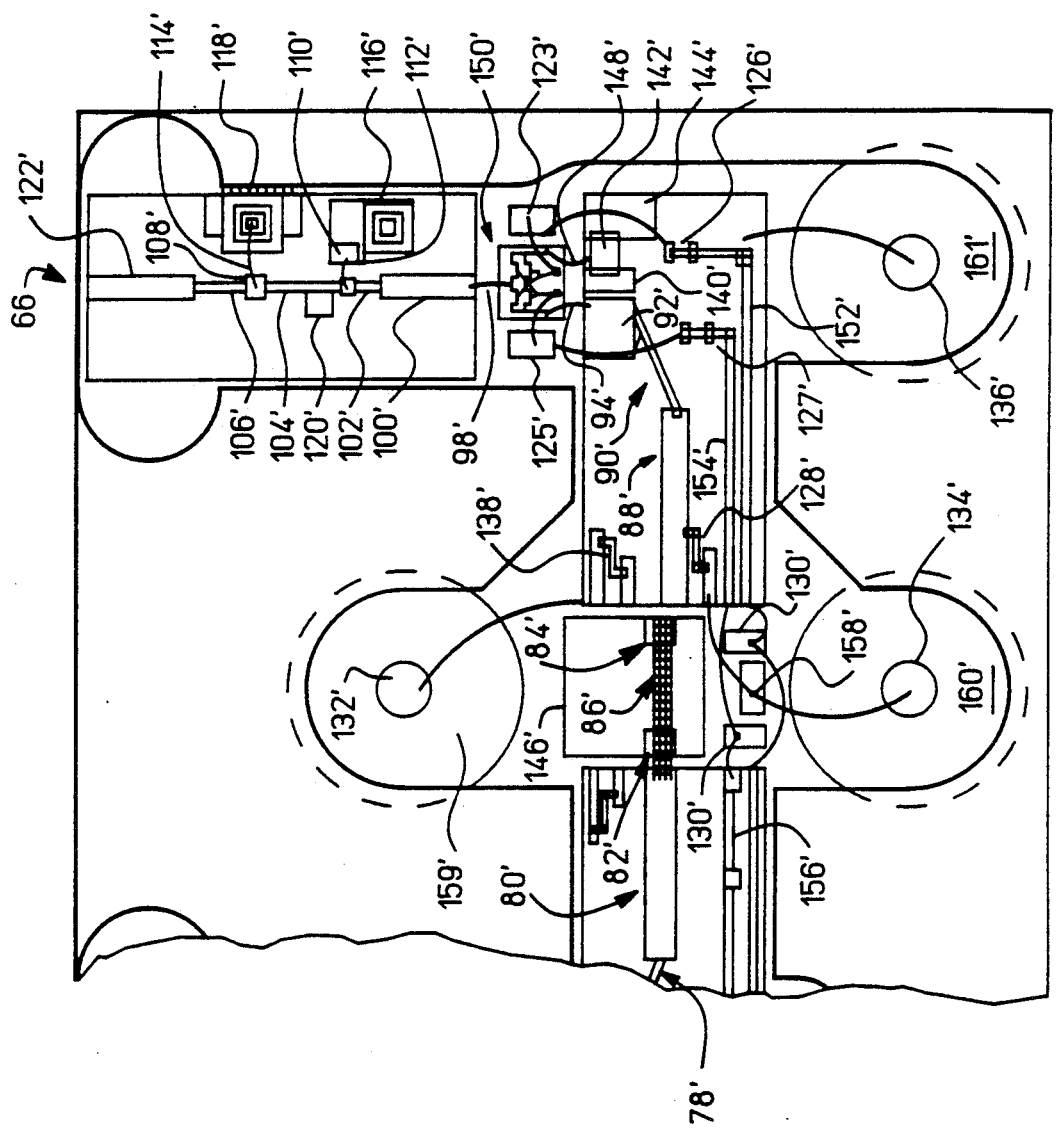
Figure 5A:
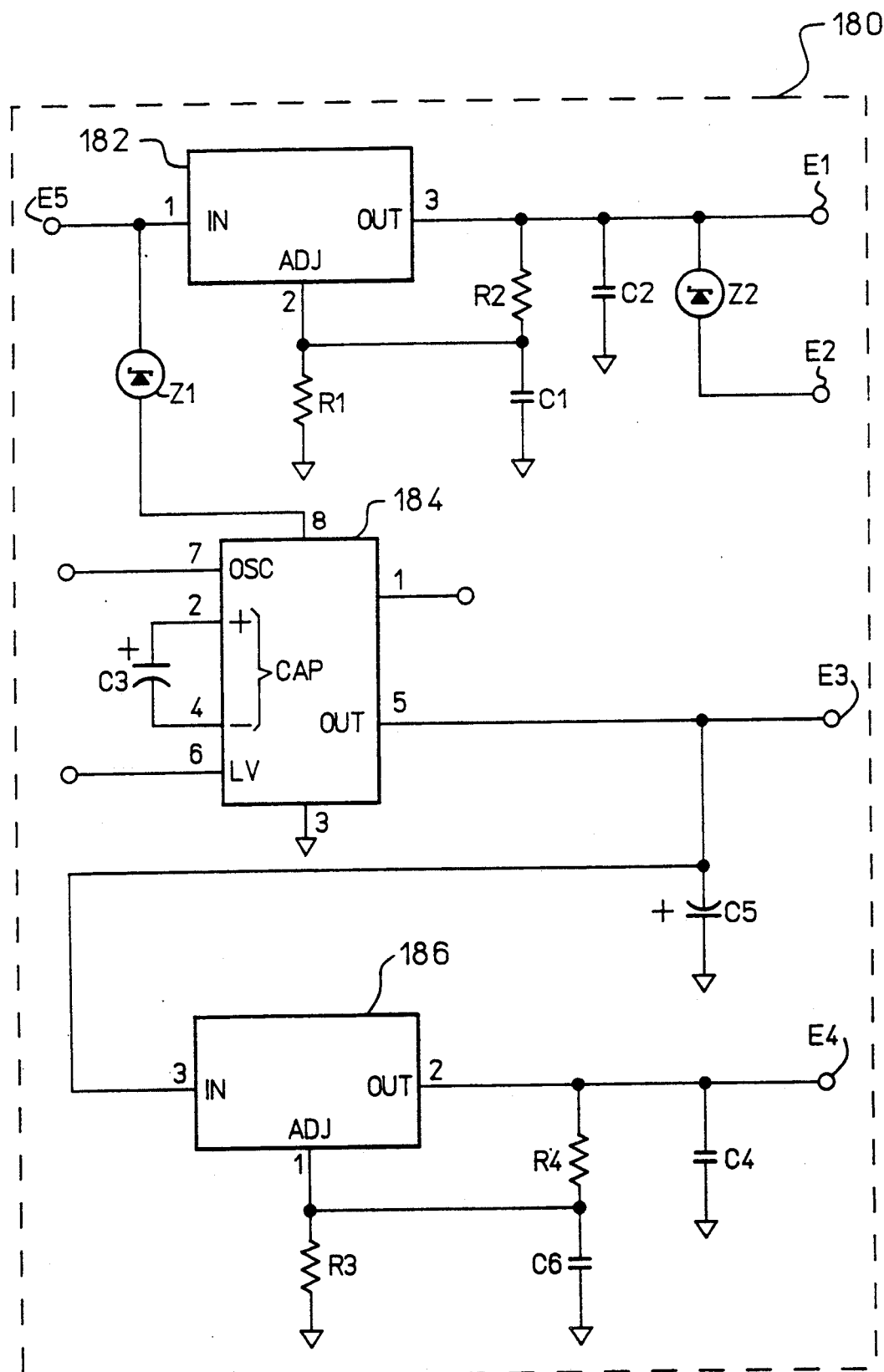
FIGS. 5A, 5B and 5C illustrate a preferred implementation of bias circuitry for the switch of FIG. 4.
Figure 5B:
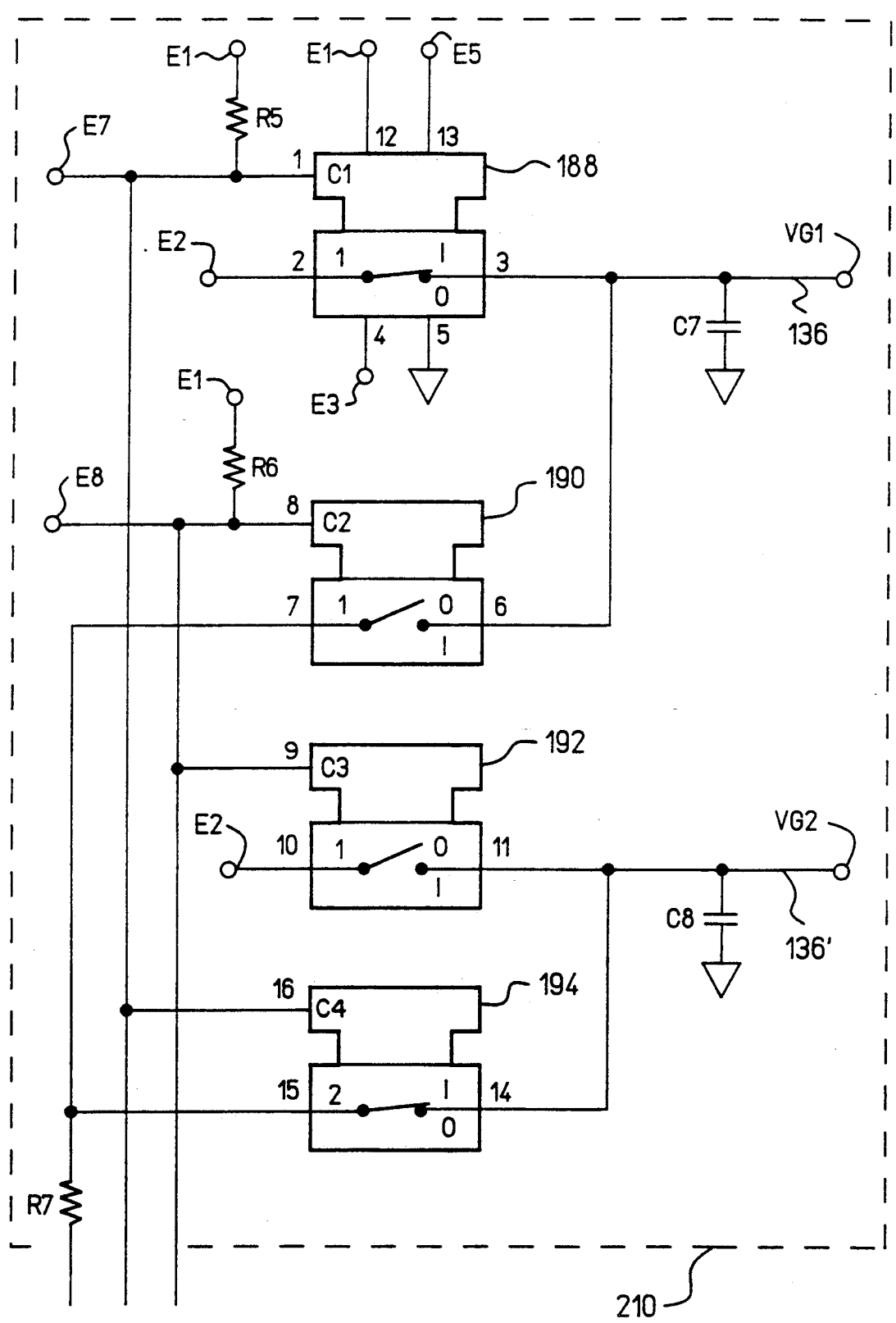
Figure 5C:
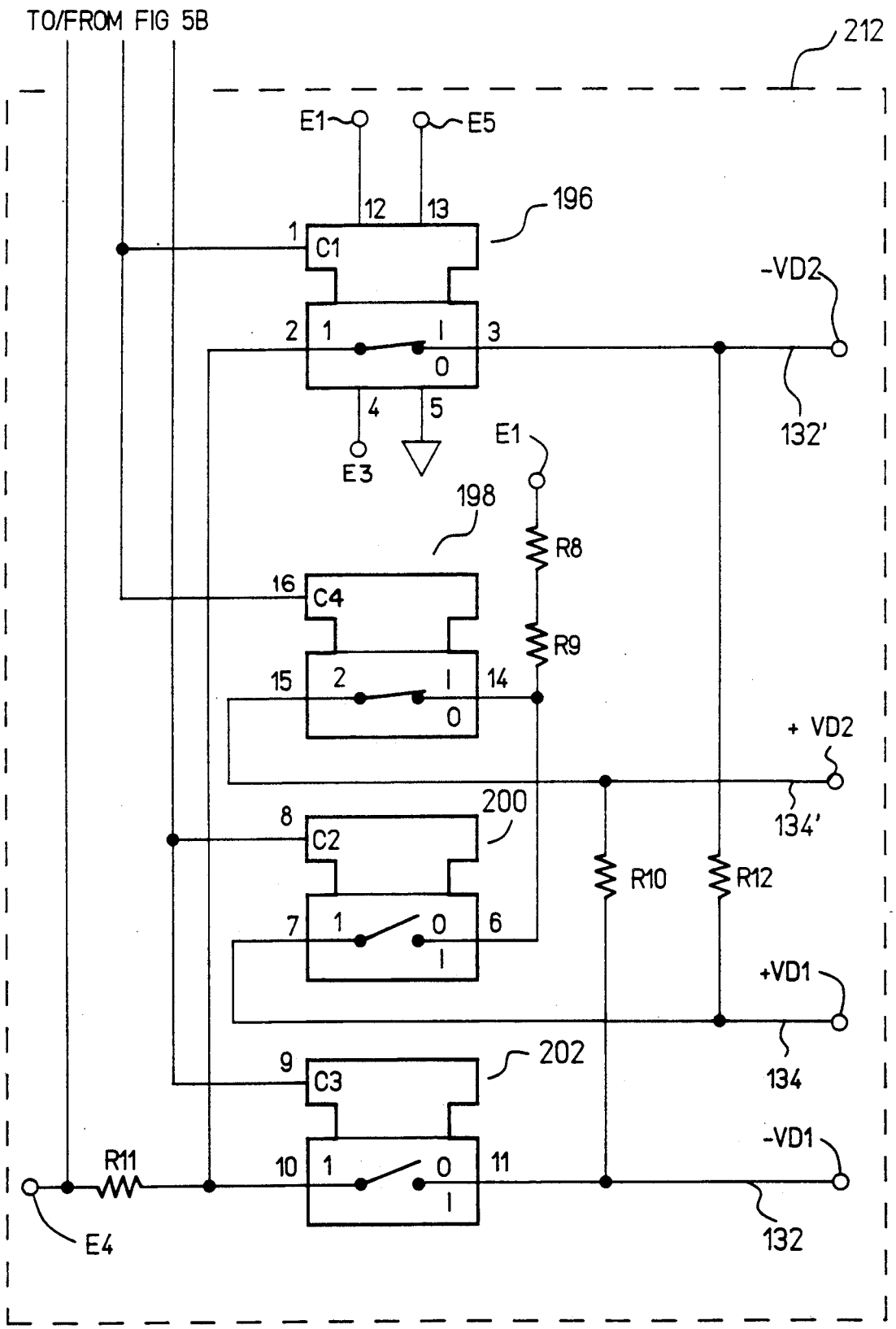

FIGS. 4A and 4B, 5A through 5C, and 6A and 6B illustrate the most preferred embodiment of a hybrid GaAs MMIC FET-PIN diode switch according to the invention. FIGS. 4A and 4B illustrate the topology of the most preferred embodiment, FIGS. 5A through 5C illustrate a preferred implementation for bias circuitry for the switch of FIGS. 4A and 4B, and FIGS. 6A and 6B are a schematic diagram of the switch of FIGS. 4A and 4B. The principles of the circuits of FIGS. 1 and 2 are applicable to those of FIGS. 4A and 4B, 5A through 5C, and 6A and 6B.

The solid state switch 60 of FIGS. 4A, 4B, 6A and 6B is most preferably a three port device (although the principles of the invention may be employed in a switch having more or less ports), with one port being the common port 62, and the other ports being switched ports, and labeled 64 and 66 in FIGS. 4A, 4B, 6A and 6B. Switch 60 has two states. State 1 provides a low loss path from the common port 62 to port 64 with high isolation between the common port 62 and port 66, and with port 66 presenting a good match. State 2 provides a low loss path between the common port 62 and port 66, and a good match at port 64.

Switch 60 is symmetrical about common port 62. Describing the operation of the switch from port 62 to port 64 in both states will completely describe the operation of the switch. In FIGS. 4A, 4B, 6A and 6B elements labeled with primed numerals on the side of port 66 are identical to the elements on the side of port 64 identified with unprimed numerals. Furthermore, port 64 side elements in state 1 and state 2 have the same operating conditions as port 66 side elements in state 2 and state 1, respectively.

Common port 62 is connected to a first GaAs MMIC FET switch 70 through transmission line 68, which is nominally 50 ohms. Transmission line 68 is connected to switch 70 by bond wire 72. GaAs MMIC FET switch 70 is a SPDT switch, with one side connected to the port 64 side through bond wire 74, and the other side connected to the port 66 side through bond wire 74'. GaAs MMIC FET switch 70 is controlled by applying voltages through bond wires 131 and 131'. Bypass capacitors 124 and 124' maintain isolation on bond wires 131, 131'.

GaAs MMIC FET switch 70 is connected to a pair of PIN diodes 82 and 84, through a matching structure consisting of transmission lines 76, 78 and 80. The length and impedance (or width) of these transmission lines are preferably optimized by well known methods to achieve the optimal return loss, or impedance match, looking into port 64. These lines compensate for the excess inductance of the bond wires, and excess capacitance of the GaAs MMIC FET switches and PIN diodes.

PIN diodes 82, 84 are mounted on a 1500 pF capacitor 146, which in turn is mounted on a ground plane. The cathodes of the diodes are mounted to the capacitor, and the anodes are mounted in shunt with the transmission structures 80 and 88, and gold mesh 86.

PIN diodes 82, 84 are also connected to a second GaAs MMIC FET switch 150 through transmission lines 88, 90, 92, which are optimized in the same manner as lines 76, 78, 80 to minimize the return loss at port 64. Line 92 is connected to one of the two SPDT outputs of GaAs MMIC FET switch 150 through bond wire 94. The other output is connected through bond wire 148 to gold pad 140 (FIG. 4A). Gold pad 140 (FIG. 4A) is connected to a 47.5 ohm resistor 142 which is connected to ground through a ribbon bond 144.

The common output of GaAs MMIC FET switch 150 is connected through bond wire 98 to transmission line 100. Line 100 is connected to line 102, which is connected to line 104, ribbon 120, and bond wire 112. Bond wire 112 also connects to the anode of PIN diode 110 (FIG. 4A). The cathode of PIN diode 110 (FIG. 4A) connects to the cathode of zener diode 116 (FIG. 4A). The anode of zener diode 116 (FIG. 4A) connects to ground. Line 104 connects to line 106 and to the cathode of PIN diode 108 (FIG. 4A). The anode of PIN diode 108 (FIG. 4A) is connected to the anode of zener diode 118 (FIG. 4A) through bond wire 114 (FIG. 4A). The cathode of zener diode 118 (FIG. 4A) is grounded.

In the structure described in the preceding paragraph, none of the diodes (i.e., PIN diodes 108, 110 and zener diodes 116, 118) is used in the normal operation of the switch and, hence, are not shown in FIGS. 6A and 6B. They provide protection to the sensitive GaAs MMIC FET switch in the form of a voltage limiter, clamping the voltage to 0.7 volts more than the zener voltage in either polarity, in this case +/−6.2 volts. Lines 102, 104, 106 and ribbon 120 are optimized for minimum return loss at port 64.

Transmission line 122 is connected to the port 64 connector (not shown) to complete the circuit on the port 64 side of the switch. Bias for the GaAs MMIC FET switches 70, 150, 150' is provided on pins 136 and 136' from the bias circuitry illustrated in FIG. 5B and described below. These are distributed to the correct bias points through lines 152, 154, 152' and 154'. These lines are isolated from the port 64 side to the port 66 side by the network of series resistors 126, 127, 133, 156, 127', 156', 126', 133' and bypass capacitors 123, 125, 129, 130, 123', 125', 129', 130'. Bias to the PIN diodes is provided at pins 132, 134, 132' and 134'. Pin 132 is connected to capacitor 146 through resistor 138. Pin 134 is connected to the anodes of the PIN diodes 82, 84 through the network of capacitor 158 and resistor 128.

State 1 is achieved by biasing GaAs MMIC FET switch 150 so that the side connected to resistor 142 is isolated, with the opposite side being the through-path. PIN diodes 82, 84 are reverse biased to provide very low loss by positively biasing the pin 132 and negatively biasing the pin 134.

On the port 66 side, GaAs MMIC FET switch 70 presents a short to line 76', and PIN diodes 82', 84' are forward biased to also provide a short by biasing pin 132' negative and pin 134' positive GaAs MMIC FET switch 150' presents a short to wire 94', and is isolated (open) to wire 98'. This provides for very high insertion loss between port 66 and port 62 when switch is in state I. The broadest band loss is achieved when the distances between the GaAs MMIC FET switches 70, 150, 150' and PIN diodes 82, 84, 82', 84' approaches ¼ wavelength at the highest frequency of operation. Transmission lines 76', 78', 80', 88', 90' and 92' are preferably optimized by well known means to yield maximum insertion loss with the switch in state 1.

Port 66 presents a good RF match by connecting GaAs MMIC FET switch 150' through to wire 148', and to the resistor network of pad 140'(FIG. 4B), thin film resistor 142' and ground 144'. Pad 140' (FIG. 4B) and resistor 142' are optimized by well known means to yield minimum return loss at port 66.

Finally, the gates of GaAs MMIC FET switches 70, 150, 150' are forward biased by applying voltage at pins 136, 136'. This dramatically increases the power handling capability of switch 60 by limiting RF self bias effects in the GaAs MMIC FET switches. In the internal series FET's of switches present in the low loss state, the gate current is removed through the drain by negatively biasing pin 134 with a voltage which just draws out the gate current though resistor 128. The voltage is chosen to maintain zero volts on transmission line 88. All the DC feedthroughs are provided with integrated bypass capacitors 159, 160, 161, 159', 160' and 161' (value 10,000 pF) to provide isolation in the bias paths.

In the circuit depicted in FIGS. 4A, 4B, 6A and 6B the circuit components have the following values: Capacitors 129, 129', 130, 130', and 158, 158' are most preferably about 80 pF. Capacitors 146, 146' are most preferably about 1500 pF. Resistors 126, 126', 127, 127' and 133, 133' are preferably about 200 ohms; resistors 128, 128' and 156, 156' are preferably about 650 ohms; and resistors 138, 138' are preferably about 450 ohms. Capacitors 123, 123', 124, 124' and 125, 125' are preferably about 80 pF.

Referring to FIGS. 5A through 5C, a preferred implementation of the bias circuitry earlier referenced is illustrated. Pins for effecting connection to the hybrid switch of FIGS. 4A, 4B, 6A and 6B are labeled 132, 134, 136, 132', 134' and 136', and these are preferably coupled to pins of like reference numerals on the circuitry of FIGS. 4A, 4B, 6A and 6B. As shown, the bias circuitry comprises three sections: a FET gate bias section 210; a PIN bias section 212; and, a power supply section 180. The power supply section 180 supplies the voltages E1-E4 utilized by sections 210 and 212. Section 210 provides bias to the GaAs MMIC FET switches 70, 150, 150'; (FIGS. 4A, 4B), 6A and 6B; section 212 provides bias to PIN diodes 82, 84, 82', 84'(FIGS. 4A, 4B), 6A and 6B.

In the power supply section 180, a voltage regulator 182 includes an input (pin1) connected to an unregulated DC voltage source E5, as shown in FIG. 5A. The voltage regulator 182 supplies the regulated voltage E1 at an output (pin 3). A zener diode Z2 is connected to the output (pin 3) of the voltage regulator 182 to supply the regulated voltage E2.

As shown in FIG. 5A, pin 2 of the voltage regulator 182 is connected to ground through a resistor R1. Additionally, the output (pin 3) of the voltage regulator 182 is connected to ground through a resistor R2 and capacitor C2. The junction between the resistor R2 and the capacitor C1 is also connected to pin 2 of the voltage regulator 182. The output (pin 3) of the voltage regulator 182 is also connected to ground through a capacitor C2.

The unregulated DC voltage E5 is also connected by a zener diode Z1 to the power input (pin 8) of a voltage converter 184. Pin 3 of the voltage converter 184 is connected to ground. A capacitor C3 is connected between pins 2 and 4 of the voltage converter 184 with a polarity shown in FIG. 5A. The voltage converter 184 supplies the negative DC voltage E3 at an output (pin 5).

Still referring to FIG. 5A, the output (pin 5) of the voltage converter 184 is connected to an input (pin 3) of a voltage regulator 186. The output (pin 5) of the voltage converter 184 is also connected to ground through a capacitor C5. The voltage regulator 186 supplies the regulated negative DC voltage E4 at an output (pin 2).

As shown in FIG. 5A, pin 1 of the voltage regulator 186 is connected to ground through a resistor R3. Additionally, the output (pin 2) of the voltage regulator 186 is connected to ground through a resistor R4 and capacitor C6. The junction between the resistor R4 and the capacitor C6 is also connected to pin 1 of the voltage regulator 186. The output (pin 2) of the voltage regulator 186 is also connected to ground through a capacitor C4.

The FET gate bias section 210 comprises an integrated circuit having switches 188, 190, 192 and 194, as shown in FIG. 5B. The regulated DC voltage E3 is connected to pin 4 of this integrated circuit. Pin 5 of this integrated circuit is connected to ground. The regulated DC voltage E1 is connected to pin 12 of this integrated circuit. The unregulated DC voltage E5 is connected to pin 13 of this integrated circuit.

A control input (pin 1) of the switch 188 is connected through a resistor R5 to the regulated DC voltage E1. An input (pin 2) of the switch 188 is connected to the regulated DC voltage E2. The switch 188 is normally closed. An output (pin 3) of the switch 188 normally supplies a voltage VG1 at the terminal 136 (FIGS. 4A, 5B and 6A). The control input (pin 1) of the switch 188 is also connected to the LO input E7 employed to operate this switch to an open position. The output (pin 3) of the switch 188 is also connected to ground through a capacitor C7.

Still referring to FIG. 5B, a control input (pin 8) of the switch 190 is connected through a resistor R6 to the regulated DC voltage E1. The switch 190 is normally open. An output (pin 6) of the switch 190 is connected to the terminal 136 and through the capacitor C7 to ground. The control input (pin 8) of the switch 190 is also connected to a HI input E8 employed to operate this switch to a closed position. Pin 7 of the switch 190 is connected through a resistor R7 to the regulated negative DC voltage E4 (FIG. 5C). When the switch 190 is closed, the voltage VG1 appearing at the terminal 136 becomes negative.

As shown in FIG. 5B, a control input (pin 16) of the switch 194 is connected through the resistor R5 to the regulated DC voltage E1. The switch 194 is normally closed. PIN 15 of the switch 194 is connected through the resistor R7 to the regulated negative DC voltage E4 (FIG. 5C). AN output (pin 14) of the switch 194 normally supplies a negative voltage VG2 at the terminal 136' (FIGS. 4B, 5B and 6B). The control input (pin 16) of the switch 194 is also connected to the LO input E7 employed to operate this switch to an open position. The output (pin 14) of the switch 194 is also connected to ground through a capacitor C8.

Still referring to FIG. 5B, a control input (pin 9) of the switch 192 is connected through a resistor R6 to the regulated DC voltage E1. The switch 192 is normally open. An output (pin 11) of the switch 192 is connected to the terminal 136' (FIGS. 4B, 5B and 6B) and through the capacitor C8 to ground. The control input (pin 9) of the switch 192 is also connected to the HI input E8 employed to operate this switch to a closed position. Pin 10 of the switch 192 is connected to the regulated DC voltage E2. When the switch 192 is closed, the voltage VG2 appearing at the terminal 136' becomes positive.

The PIN bias section 212 comprises an integrated circuit having switches 196, 198, 200 and 202, as shown in FIG. 5C. Pin 4 of this integrated circuit is connected to the regulated DC voltage E3. Pin 5 of this integrated circuit is connected to ground. The regulated DC voltage E1 is connected to pin 12 of this integrated circuit. The unregulated DC voltage E5 is connected to pin 13 of this integrated circuit.

As shown in FIGS. 5B and 5C, a control input (pin 1) of the switch 196 is connected through the resistor R5 to the regulated DC voltage E1. The switch 196 is normally closed. Pin 2 of the switch 196 is connected through a resistor R11 to the regulated negative DC voltage E4. An output (pin 3) of the switch 196 normally supplies a regulated negative DC voltage $-VD2$ at the terminal 132' (FIGS. 4B, 5C and 6B). The output (pin 3) of the switch 196 is connected through a resistor R12 to the terminal 134 (FIGS. 4A, 5C and 6A). The control input (pin 1) of the switch 196 is also connected to the LO input E7 (FIG. 5B) employed to operate this switch to an open position.

Still referring to FIGS. 5B and 5C, a control input (pin 16) of the switch 198 is connected through the resistor R5 to the regulated DC voltage E1. The switch 198 is normally closed. Pin 14 of the switch 198 is connected through resistors R8 and R9 to the regulated DC voltage E1. An output (pin 15) of the switch 198 normally supplies a positive voltage $+VD2$ at the terminal 134') (FIGS. 4B, 5C and 6B). The output (pin 15) of the switch 198 is also connected through a resistor R10 to the terminal 132 (FIGS. 4A, 5C and 6A). The control input (pin 16) of the switch 198 is also connected to the LO input E7 (FIG. 5B) employed to operate this switch to an open position.

As shown in FIGS. 5B and 5C, a control input (pin 8) of the switch 200 is connected through the resistor R6 to the regulated DC voltage E1. The switch 200 is normally open. An output (pin 7) of the switch 200 is connected to the terminal 134 (FIGS. 4A, 5C and 6A) and through the resistor R12 to the terminal 132' (FIGS. 4B, 5C and 6B). The control input (pin 8) of switch 200 is also connected to the HI input E8 (FIG. 5B) employed to operate this switch to a closed position. Pin 6 of the switch 200 is connected through the resistors R8 and R9 to the regulated DC voltage E1. When the switch 200 is closed, the voltage $+VD1$ appearing at the terminal 134 becomes positive.

Finally, still referring to FIGS. 5B and 5C, a control input (pin 9) of the switch 202 is connected through the resistor R6 to the regulated DC voltage E1. The switch 202 is normally open. An output (pin 11) of the switch 202 is also connected to the terminal 132 (FIGS. 4A, 5C and 6A) and through the resistor R10 to the terminal 134' (FIGS. 4B, 5C and 6B). The control input (pin 9) of the switch 202 is also connected to the HI input E8 (FIG. 5B) employed to operate this switch to a closed position. Pin 10 of the switch 202 is connected through the resistor R11 to the regulated negative DC voltage E4. When the switch 202 is closed, the voltage $-VD1$ appears at the terminal 132 (FIGS. 4A, 5C and 6A).

The normal operational voltage and current for state 1 for each pin is labeled in Table 1 below along with preferred values for the circuit components. Different methods can be used to obtain different voltages, but this scheme and these voltages have been employed to allow pin for pin compatibility with the HP 33311 B/C mechanical switch, which the switch of FIGS. 4A and 4B can replace. The compact size of the circuitry and hybrid housing (discussed below) allow this to be a drop-in replacement for the HP 33311 B/C mechanical switch. The only critical circuitry in the bias circuitry is the arrangement of capacitors C7 and C8. These capacitors are needed to provide low frequency bypass of the gate bias lines, and should be within about 1 inch of the DC feedthrough to prevent parasitic inductance from causing a parallel resonant circuit, 6A and 6B between the DC feedthrough capacitors and capacitors 161 or 161'(FIGS. 4A, 4B). Those skilled in the art will appreciate that the bias circuitry of FIGS. 5A through 5C employ a $V_d$ matching technique as earlier described. Resistor R7 is used to prevent large current flow from the +3.7 volt supply to the −9.1 volt supply during switching transients, or if both inputs (E7 and E8) are left open. In operation, one must be ground and the other must be open.

In the power supply section 180, device 182 provides regulated drive for the positive voltage requirements, device 184 provides voltage inversion for a negative supply, and device 186 regulates the negative supply. Chips 188, 190, 192, 194, 196, 198, 200 and 202 are switches which route the correct bias to the hybrid bias pins.

TABLE 1

| Component or Reference Numeral | Description |
| --- | --- |
| 70, 150, 150' | HP part no. TC703 |
| 82, 84, 82', 84' | HP part no. 5082-0001 |
| 182 | LM317 voltage regulator |
| 184 | SI7661 voltage converter |
| 186 | LM337 voltage regulator |
| 188-202 | DG411 switch |
| C1 | 0.047 μF |
| C2 | 0.047 μF |
| C3 | 10 μF |
| C4 | 0.047 μF |
| C5 | 10 μF |
| C6 | 0.047 μF |
| C7 | 0.47 μF |
| C8 | 0.47 μF |
| E1 | +16.5 V |
| E2 | +3.7 V |
| E3 | −14 V |
| E4 | −9.1 V |
| E5 | +20 V |
| E7 | LO input |
| E8 | HI input |
| R1 | 5.62 KΩ |
| R2 | 470 Ω |
| R3 | 2.87 KΩ |
| R4 | 470 Ω |
| R5 | 51.1 KΩ |
| R6 | 51.1 KΩ |
| R7 | 1.0 KΩ |
| R8 | 470 Ω |
| R9 | 1.0 KΩ |
| R10 | 1.0 KΩ |
| R11 | 470 Ω |
| R12 | 1.8 kΩ |
| +VD1 | −1.625 V @ 2.5 mA |
| −VD1 | +5.1 V @ 0 mA |
| −VD2 | −4.2 V @ 7.0 mA |
| +VD2 | +5.1 V @ 7.0 mA |
| VG1 | +3.7 V @ 5 mA |
| VG2 | −9.1 V @ 0 mA |
| Z1 | 5.1 V zener diode |

TABLE 1-continued

| Component or Reference Numeral | Description |
| --- | --- |
| Z2 | 13 V zener diode |

Figure 7:
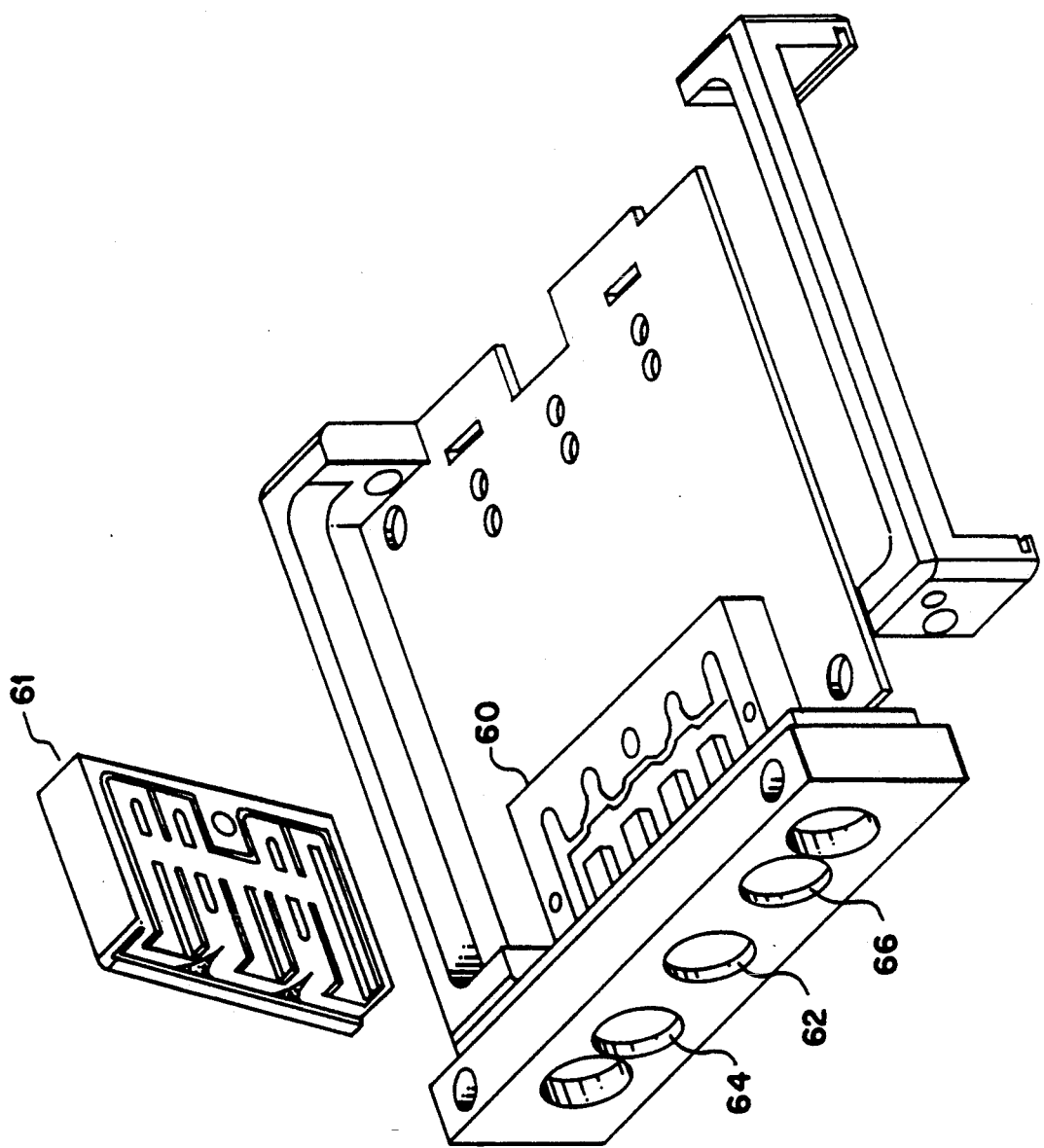
FIG. 7 illustrates a preferred housing for the switch of FIG. 4.

Referring to FIG. 7, therein is depicted a preferred housing for the circuit of FIGS. 4A and 4B. As discussed above, this housing is designed for drop-in compatibility between the circuit shown in FIGS. 4A and 4B and the HP 33311 B/C mechanical switch. The ports 62, 64, 66 correspond to those of FIGS. 4A and 4B, and the circuitry 60, including a cover 61, are shown.

Figure 8A:
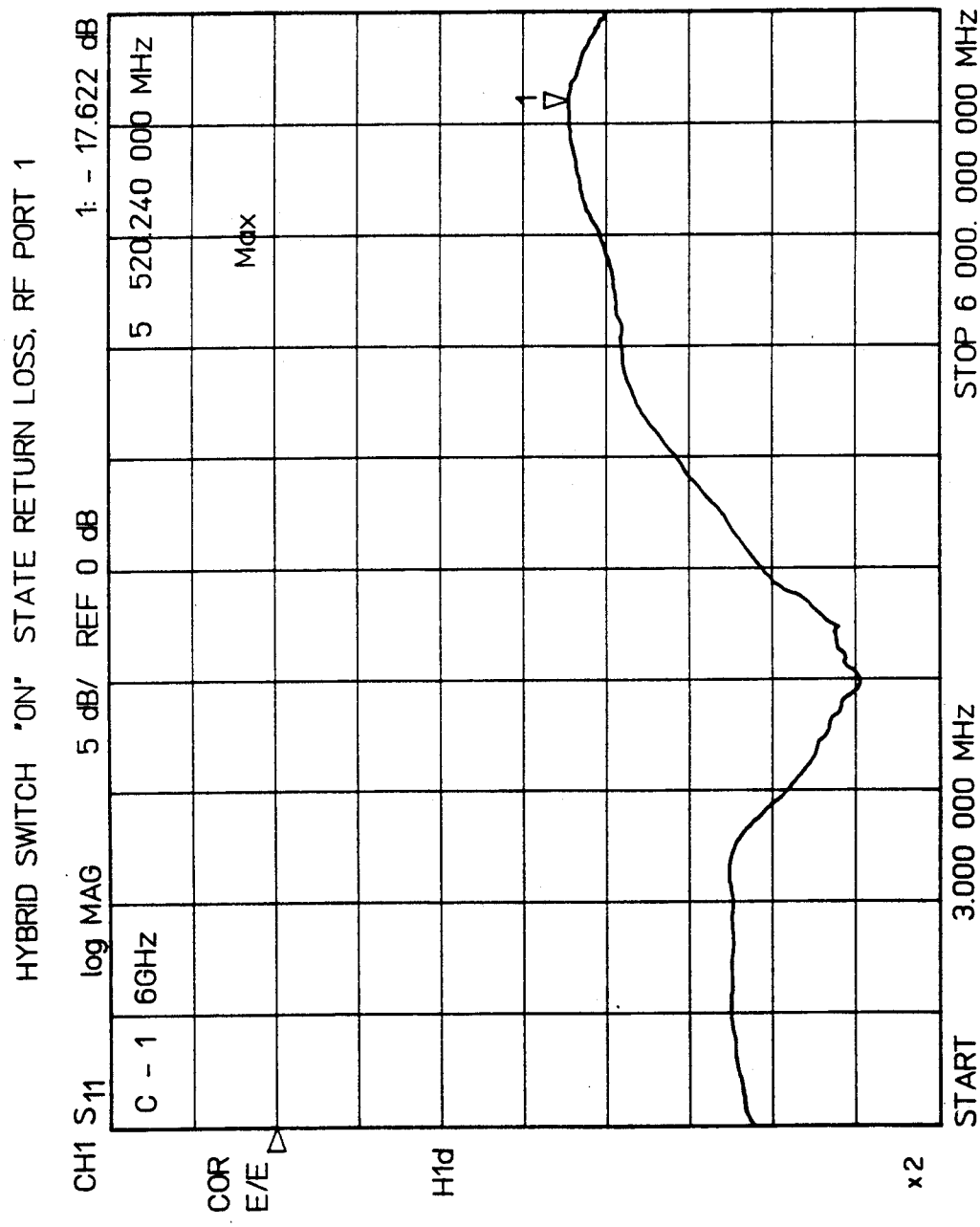
FIGS. 8A through 8D are graphs illustrating the performance of the switch of FIG. 4.
Figure 8B:
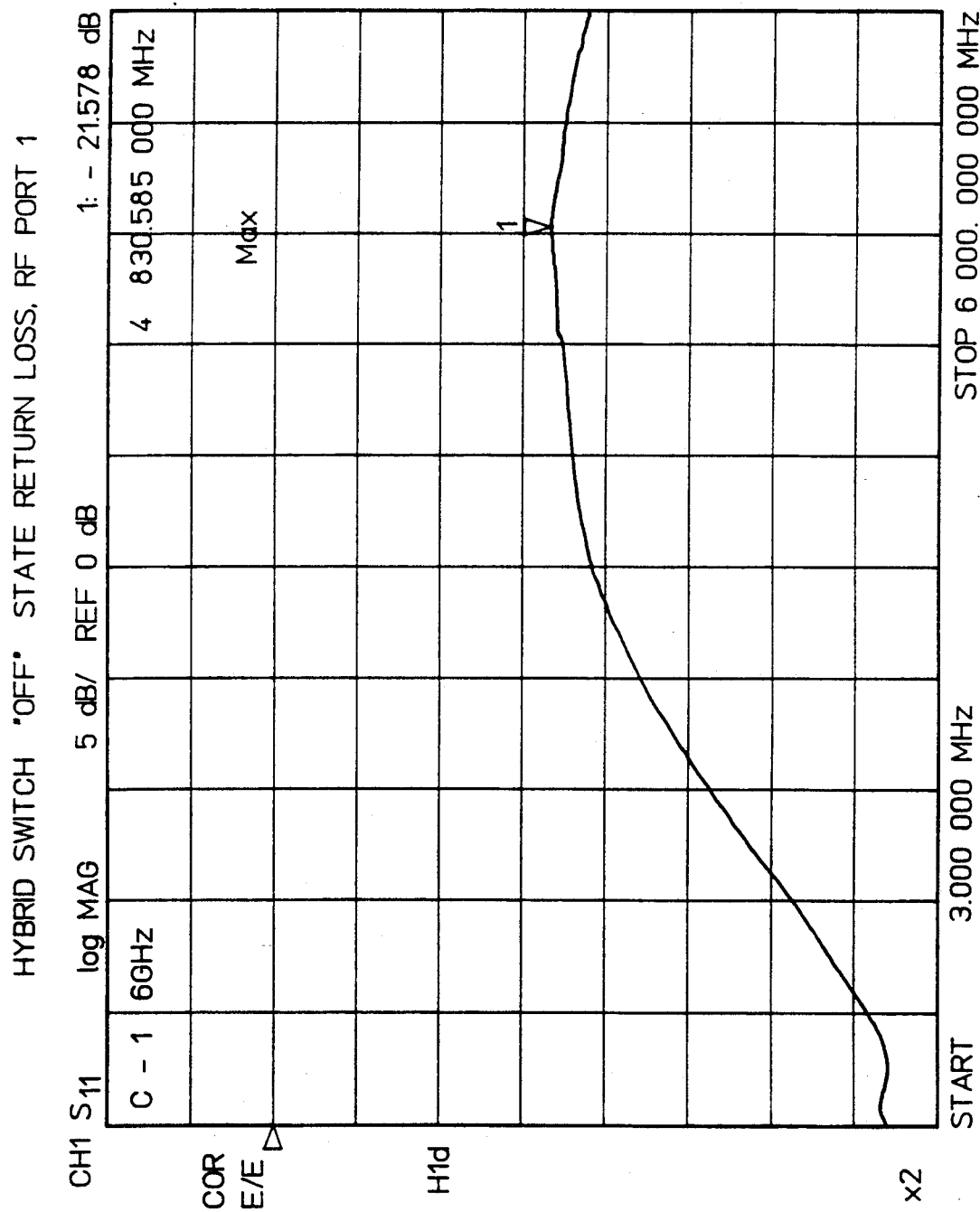
Figure 8C:
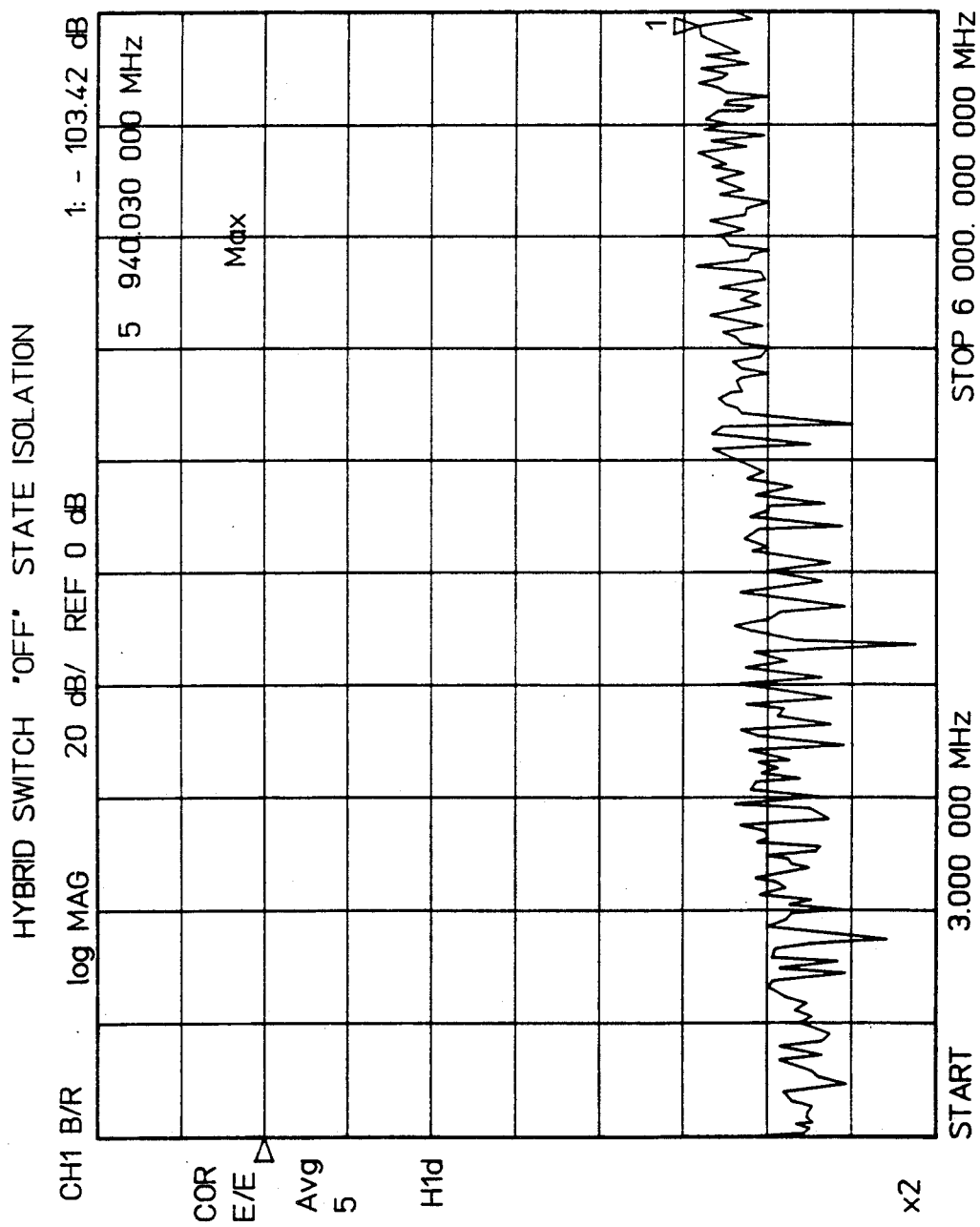
Figure 8D:
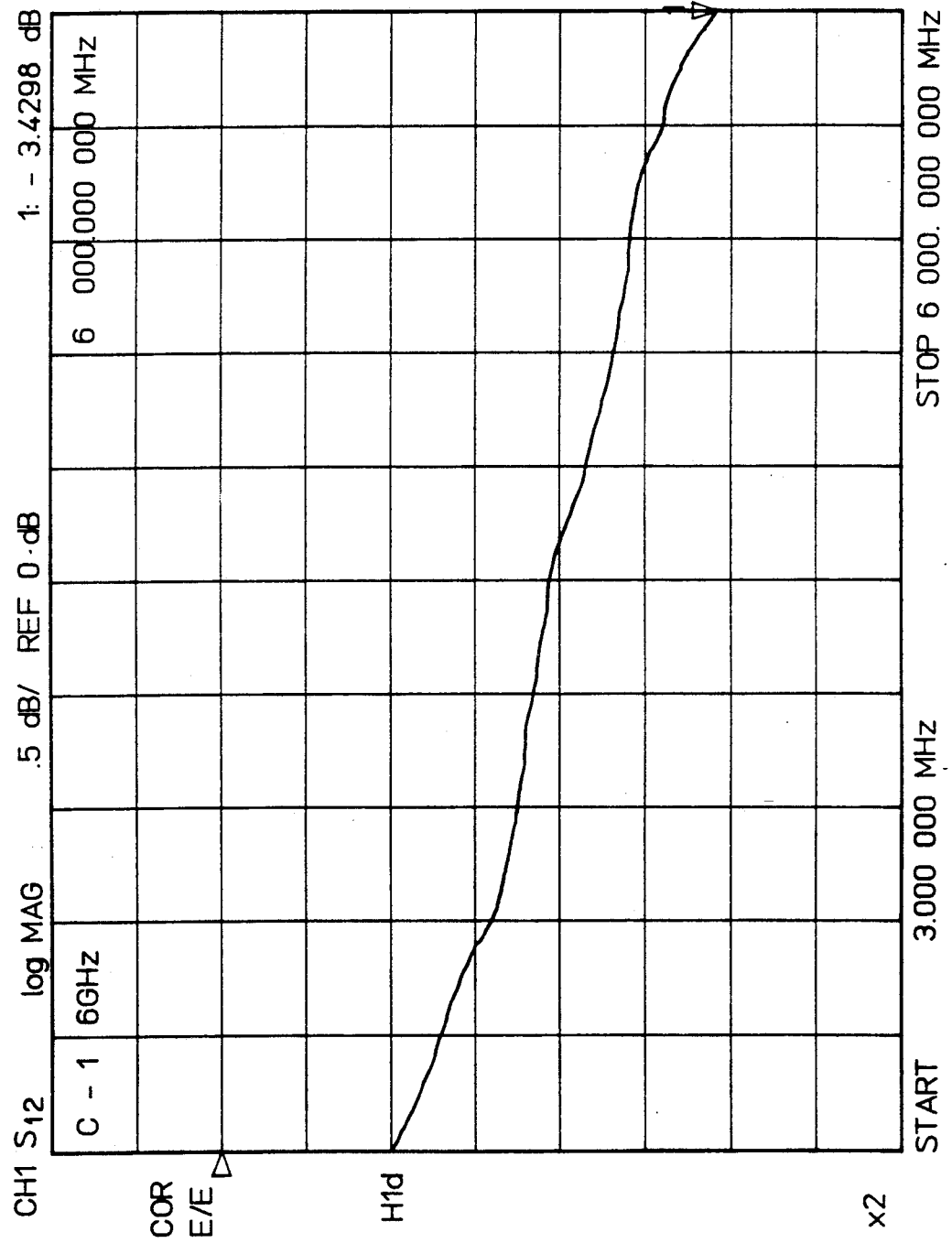

FIGS. 8A through 8D illustrate the performance of the switch of FIGS. 4A, 4B, 6A and 6B. FIG. 8A illustrates the "on" state return loss as measured at RF port 1. FIG. 8A illustrates the frequency response of the switch 60 in the "on" state over a frequency range from 3.0 MHz to 6.0 GHz using a network analyzer to measure the "on" state return loss. As shown in FIG. 8A, the maximum "on" state return loss over this frequency range indicated by marker 1 is measured to be approximately −17.6 dB. FIG. 8B illustrates the "off" state return loss as measured at RF port 1. FIG. 8B illustrates the frequency response of the switch 60 in the "off" state over a frequency range from 3.0 MHz to 6.0 GHz using a network analyzer to measure the "off" state return loss. As shown in FIG. 8B, the maximum "off" state return loss over this frequency range indicated by marker 1 is measured to be approximately −21.6 dB. FIG. 8C illustrates the "off" state isolation of the switch. FIG. 8C illustrates the frequency response of the switch 60 in the "off" state over a frequency range from 3.0 MHz to 6.0 GHz using a network analyzer to measure the "off" state isolation. As shown in FIG. 8C, the maximum "off" state isolation over this frequency range indicated by marker 1 is measured to be approximately −103.4 dB. FIG. 8D illustrates the "on" state insertion loss of the switch. FIG. 8D illustrates the frequency response of the switch 60 in the "on" state over a frequency range from 3.0 MHz to 6.0 GHz using a network analyzer to measure the "on" state insertion loss. As shown in FIG. 8D, the minimum "on" state insertion loss over this frequency range indicated by marker 1 is measured to be approximately −3.4 dB.

The present invention can be embodied in other specific forms without departing from the spirit or essential attributes thereof, and, accordingly, reference should be made to the appended claims rather than to the foregoing specification as indicating the scope of the invention.

I claim:

1. An electronic switch comprising:
    (a) at least first and second electronic switches, each switch having first and second RF ports;
    (b) a first transmission line having a first characteristic impedance and electrical length $l_1$ cascaded with said second RF port of said first switch;
    (c) a second transmission line connected to said first transmission line, said second transmission line having a second characteristic impedance and electrical length $l_2$ cascaded with said second RF port of said second switch; and
    (d) at least a first PIN diode connected at the interconnection of said first and second transmission lines, and also coupled to bias circuitry;
    the first and second characteristic impedances and electrical lengths $l_1$, $l_2$ of said first and second transmission lines having input and output impedances within a predefined range of impedances.

2. Switch of claim 1 wherein said bias circuitry is coupled to said first and second switches for forward biasing said first and second switches to prevent self bias of the first and second switches in a low loss state at high RF drive power.

3. Switch of claim 1 wherein each of said first and second switches further comprises a common port and wherein, in an "off" state, the second RF port of the first switch is electrically connected to the common port of the first switch and the second RF port of the second switch is electrically connected to the common port of the second switch and wherein, in an "on" state, the first RF port of the first switch is electrically connected to the common port of the first switch and the first RF port of the second switch is electrically connected to the common port of the second switch.

4. Switch of claim 1 wherein $l_1$ and $l_2$ are approximately one quarter wavelength at a given frequency of operation.

5. Switch of claim 1 wherein said first and second characteristic impedances are approximately 50 ohms.

6. Switch of claim 1 wherein said bias circuitry comprises $V_d$ matching DC bias circuitry coupled to said first PIN diode to maintain a DC voltage level of less than about 0.4 V on said first and second transmission lines.

7. Switch of claim 1 wherein said bias circuitry comprises:
   (a) a first resistor coupled between a first source of forward DC bias current and a first terminal of said first PIN diode;
   (b) a capacitor connected between a second terminal of said first PIN diode and ground;
   (c) a second PIN diode having a first terminal coupled to said capacitor and to the second terminal of said first PIN diode, and a second terminal coupled to ground; and
   (d) a second resistor connected between the first terminal of said second PIN diode and a second source of forward DC bias current.

8. A hybrid GaAs MMIC FET-PIN diode electronic transfer switch comprising:
   (a) at least first and second GaAs MMIC SPDT FET switches, each switch comprising first and second RF ports and one RF port defining a common port, and two control ports for input of control signals for actuating the switches, each of said first and second switches comprising at least two FET's, each FET having a drain, source and gate, the drain of the first FET being connected to the source of the second FET and to the common port, the source of the first FET being connected to the first RF port and the drain of the second FET being connected to the second RF port, the gate of each FET being connected to a respective control port;
   (b) a first transmission line having a first characteristic impedance and electrical length $l_1$ cascaded with said second RF port of said first switch;
   (c) a second transmission line connected to said first transmission line, said second transmission line having a second characteristic impedance and electrical length $l_2$ cascaded with said second RF port of said second switch; and
   (d) at least a first PIN diode connected at the interconnection of said first and second transmission lines, and also coupled to bias circuitry, the bias circuitry comprising:
      i) a first resistor coupled between a first source of forward DC bias current and a first terminal of said first PIN diode;
      ii) a capacitor connected between a second terminal of said first PIN diode and ground;
      iii) a second PIN diode having a first terminal coupled to said capacitor and to the second terminal of said first PIN diode, and a second terminal coupled to ground; and
      iv) a second resistor connected between the first terminal of said second PIN diode and a second source of forward DC bias current;
   the first and second characteristic impedances of the first and second transmission lines being about 50 ohms, and the lengths $l_1$ and $l_2$ being about one quarter wavelength at a given frequency of operation.

9. Switch of claim 8 wherein said bias circuitry is coupled to the gates of said GaAs MMIC FET switches for forward biasing said GaAs MMIC FET switches to prevent self bias of the GaAs MMIC FET switches in a low loss state at high RF drive power.

10. A hybrid GaAs MMIC FET-PIN diode electronic transfer switch comprising:
   (a) at least first and second GaAs MMIC FET switches, each switch having at least first and second RF ports, each switch having one of a drain and a source connected to the first RF port and the other of the drain and the source connected to the second RF port, each switch also having a gate connected to a respective control port;
   (b) a first transmission line having a first characteristic impedance and electrical length $l_1$ cascaded with said second RF port of said first switch;
   (c) a second transmission line connected to said first transmission line, said second transmission line having a second characteristic impedance and electrical length $l_2$ cascaded with said second RF port of said second switch; and
   (d) at least a first PIN diode connected at the interconnection of said first and second transmission lines, and also coupled to bias circuitry;
   (e) the first and second characteristic impedances and electrical lengths $l_1$, $l_2$ of said first and second transmission lines having input and output impedances within a predefined range of impedances.

11. Switch of claim 10 wherein said bias circuitry is coupled to the gates of said GaAS MMIC FET switches for forward biasing said GaAs MMIC FET switches to prevent self bias of the GaAs MMIC FET switches in a low loss state at high RF drive power.

12. Switch of claim 10 wherein each of said first and second switches further comprises a common port and first and second FET's each having a drain, source and gate, the drain of the first FET being connected to the source of the second FET and to the common port, the source of the first FET being connected to the first RF port and the drain of the second FET being connected to the second RF port, and wherein there are two control ports for each of said first and second switches, the gate of each FET being connected to a respective control port, and wherein, in an "off" state, the second RF port of the first switch is electrically connected to the common port of the first switch and the second RF port of the second switch is electrically connected to the common port of the second switch and wherein, in an "on" state, the first RF port of the first switch is electrically connected to the common port of the first switch and the first RF port of the second switch is electrically connected to the common port of the second switch.

13. Switch of claim 10 wherein $l_1$ and $l_2$ are approximately one quarter wavelength at a given frequency of operation.

14. Switch of claim 10 wherein said first and second characteristic impedances are approximately 50 ohms.

15. Switch of claim 10 wherein said bias circuitry comprises:
(a) a first resistor coupled between a first source of forward DC bias current and a first terminal of said first PIN diode;
(b) a capacitor connected between a second terminal of said first PIN diode and ground;
(c) a second PIN diode having a first terminal coupled to said capacitor and to the second terminal of said first PIN diode, and a second terminal coupled to ground; and
(d) a second resistor connected between the first terminal of said second PIN diode and a second source of forward DC bias current.

16. An electronic switch comprising:
(a) a first GaAs MMIC FET switch having a drain, source and gate;
(b) a first pair of PIN diodes connected in parallel with each other, one terminal of each of said first pair of PIN diodes being connected to the drain of said first GaAs MMIC FET switch;
(c) a second pair of PIN diodes connected in parallel with each other, one terminal of each of said second pair of PIN diodes being connected to the source of said first GaAs MMIC FET switch;
(d) a second GaAs MMIC FET switch having a drain, source and gate, the drain of said second GaAs MMIC FET being connected to said one terminal of each of said first pair of PIN diodes and the source of said second GaAs MMIC FET being grounded through a first resistive load;
(e) a third GaAs MMIC FET switch having a drain, source and gate, the source of said second GaAs MMIC FET being connected to said one terminal of each of said second pair of PIN diodes and the drain of said second GaAs MMIC FET being grounded through a second resistive load; and
(f) bias circuitry connected to another terminal of each of said pairs of PIN diodes and to the gates of each of said GaAs MMIC FET switches for providing a level of DC biasing to said PIN diodes and GaAs MMIC FET switches.

17. Switch of claim 16 wherein said bias circuitry is coupled to the gates of said GaAs MMIC FET switches for forward biasing said GaAs MMIC FET switches to prevent self bias of the GaAs MMIC FET switches in a low loss state at high RF drive power.

18. Switch of claim 16 further comprising: first and second transmission lines through which said one terminal of each of said first pair of PIN diodes is connected to said first and second GaAs MMIC FET switches, respectively, and third and fourth transmission lines through which said one terminal of each of said second pair of PIN diodes is connected to said first and third GaAs MMIC FET switches, respectively.

19. Switch of claim 16 wherein said bias circuitry comprises $V_d$ matching DC bias circuitry coupled to said PIN diodes.

20. Switch of claim 16 wherein said bias circuitry comprises:
(a) a first resistor coupled between a first source of forward DC bias current and said one terminal of each of said first pair of PIN diodes;
(b) a first capacitor connected between a second terminal of each of said first pair of PIN diodes and ground; and
(c) a second resistor coupled between a second source of forward DC bias current and said second terminal of each of said first pair of PIN diodes.

21. An electronic switch comprising:
(a) at least one electronic switching device having at least first and second RF ports;
(b) a first transmission line having a first characteristic impedance and electrical length $l_1$ cascaded with said first RF port of said electronic switching device;
(c) a second transmission line connected to said first transmission line, said second transmission line having a second characteristic impedance and electrical length $l_2$ connected between said first transmission line and a device under test; and
(d) at least a first PIN diode connected at the interconnection of said first and second transmission lines, and also coupled to bias circuitry;
the first and second characteristic impedances and electrical lengths $l_1$, $l_2$ of said first and second transmission lines having input and output impedance within a predefined range of impedances.

22. Electronic switch of claim 21 wherein said electronic switching device further comprises a common port and wherein, in an "off" state, the second RF port of the electronic switching device is electrically connected to the common port of the electronic switching device and wherein, in an "on" state, the first RF port of the electronic switching device is electrically connected to the common port of the electronic switching device.

23. Electronic switch of claim 21 wherein said bias circuitry comprises:
(a) a first resistor coupled between a first source of forward DC bias current and a first terminal of said first PIN diode;
(b) a capacitor connected between a second terminal of said first PIN diode and ground;
(c) a second PIN diode having a first terminal coupled to said capacitor and to the second terminal of said first PIN diode, and a second terminal coupled to ground; and
(d) a second resistor connected between the first terminal of said second PIN diode and a second source of forward DC bias current.

24. Electronic switch of claim 21 wherein $l_1$ and $l_2$ are approximately one quarter wavelength at a given frequency of operation.

25. Electronic switch of claim 21 wherein said bias circuitry comprises $V_d$ matching DC bias circuitry coupled to said first shunt PIN diode to maintain a DC voltage level of less than approximately 0.4 V on said first transmission line.

26. Electronic switch of claim 21 wherein said first and second characteristic impedances are approximately 50 ohms.

27. Electronic switch of claim 21 wherein said bias circuitry is coupled to said electronic switching device for forward biasing said electronic switching device to prevent self bias of the electronic switching device in a low loss state at high RF drive power.

* * * * *

UNITED STATES PATENT AND TRADEMARK OFFICE
CERTIFICATE OF CORRECTION

PATENT NO. : 5,103,195

DATED : April 7, 1992

INVENTOR(S) : Joel P. Dunsmore

It is certified that error appears in the above-identified patent and that said Letters Patent is hereby corrected as shown below:

Column 2, Line 18, "series-hunt" should read --series-shunt"
Column 2, Line 54, "connected to with the" should read --connected to the--
Column 7, Line 63, "positive GaAs" should read --positive. GaAs--
Column 7, Line 66, "when switch is in state I." should read --when switch 60 is in state 1.--
Column 8, Line 61, "and capacitor C2." should read --and capacitor C1.--
Column 9, Line 56, "PIN 15" should read --Pin 15--
Column 9, Line 58, "AN output" should read --An output--
Column 10, Line 37, "134')" should read --134'--
Column 11, Line 18, "(Figs. 4A, 4B)." should read --Figures 4A, 4B, 6A and 6B.--
Column 14, Line 27 "(a()" should read --(a)--
Column 16, Line 28, "output impedance" should read --output impedances--

Signed and Sealed this

Twenty-eighth Day of December, 1993

Attest:

BRUCE LEHMAN

*Attesting Officer*  *Commissioner of Patents and Trademarks*